(12) United States Patent
Melcher et al.

(10) Patent No.: US 12,416,745 B2
(45) Date of Patent: Sep. 16, 2025

(54) ELECTRONIC DEVICES HAVING GLASS LAYERS WITH SCRATCH RESISTANT COATINGS

(71) Applicant: Apple Inc., Cupertino, CA (US)

(72) Inventors: Martin Melcher, Paris (FR); Matthew S. Rogers, San Jose, CA (US); Ove Lyngnes, Carmel Valley, CA (US); Que Anh S. Nguyen, San Jose, CA (US); Stephen C. Cool, San Jose, CA (US); Tyler R. Roschuk, San Jose, CA (US)

(73) Assignee: Apple Inc., Cupertino, CA (US)

( * ) Notice: Subject to any disclaimer, the term of this patent is extended or adjusted under 35 U.S.C. 154(b) by 17 days.

(21) Appl. No.: 17/667,686

(22) Filed: Feb. 9, 2022

(65) Prior Publication Data

US 2022/0268967 A1   Aug. 25, 2022

Related U.S. Application Data (60) Provisional application No. 63/213,905, filed on Jun. 23, 2021, provisional application No. 63/152,148, filed on Feb. 22, 2021.

(51) Int. Cl.
*G02B 1/14* (2015.01)
*C03C 10/00* (2006.01)
(Continued)

(52) U.S. Cl.
CPC ............... *G02B 1/14* (2015.01); *C03C 10/00* (2013.01); *C03C 17/3435* (2013.01); *H05K 5/03* (2013.01);
(Continued)

(58) Field of Classification Search
CPC ... G02B 1/14; G02B 1/18; H05K 5/03; C03C 10/00; C03C 17/3435; C03C 2204/00;
(Continued)

(56) References Cited

U.S. PATENT DOCUMENTS

8,409,716 B2   4/2013   Schultz et al.
9,776,913 B2   10/2017  Gao et al.
(Continued)

*Primary Examiner* — Ruiyun Zhang
(74) *Attorney, Agent, or Firm* — Treyz Law Group, P.C.; G. Victor Treyz; David K. Cole (57) ABSTRACT

An electronic device may be surrounded by an exterior region and may have an interior region. Electronic components may be mounted in the interior region. Housing walls such as housing walls formed from transparent layers of material may separate the interior region from the exterior region. A display may be visible through one of the transparent layers of material. A transparent layer of material may be coupled to housing structures in the device and may be formed of glass or glass-ceramic. The transparent layer may have two opposing chemically strengthened surface layers of different thicknesses. A coating may be formed on a thinner of the two opposing chemically strengthened surface layers. The coating may have an oleophobic outer coating layer, an antireflection layer, and an antiscratch layer. The antiscratch layer may have one or more compressively stressed dielectric layers and may have one or more corresponding graded composition layers.

6 Claims, 7 Drawing Sheets

(51) Int. Cl.
  *C03C 17/34* (2006.01)
  *H05K 5/03* (2006.01)
  *G02B 1/18* (2015.01)
  *H05K 5/00* (2006.01)

(52) U.S. Cl.
  CPC .... *C03C 2204/00* (2013.01); *C03C 2217/281* (2013.01); *C03C 2217/76* (2013.01); *C03C 2217/78* (2013.01); *C03C 2217/91* (2013.01); *C09K 2323/06* (2020.08); *C09K 2323/061* (2020.08); *G02B 1/18* (2015.01); *H05K 5/0017* (2013.01)

(58) Field of Classification Search
  CPC .......... C03C 2217/281; C03C 2217/76; C03C 2217/91; C09K 2323/06; C09K 2323/061
  USPC ...................................................... 428/1.62
  See application file for complete search history.

(56) References Cited

U.S. PATENT DOCUMENTS

| | | |
|---|---|---|
| 10,921,492 B2 | 2/2021 | Gregorski et al. |
| 2014/0334006 A1 | 11/2014 | Adib et al. |
| 2015/0274585 A1 | 10/2015 | Rogers et al. |
| 2016/0214889 A1* | 7/2016 | Garner ................... C03C 3/087 |
| 2018/0011225 A1 | 1/2018 | Bellman et al. |
| 2018/0275318 A1 | 9/2018 | Amin et al. |
| 2019/0337841 A1 | 11/2019 | Hart et al. |
| 2020/0247715 A1 | 8/2020 | Adib et al. |

\* cited by examiner

ELECTRONIC DEVICES HAVING GLASS LAYERS WITH SCRATCH RESISTANT COATINGS

This application claims the benefit of provisional patent application No. 63/152,148, filed Feb. 22, 2021, and provisional patent application No. 63/213,905, filed Jun. 23, 2021, which are hereby incorporated by reference herein in their entireties.

FIELD

This relates generally to coatings and, more particularly, to coatings for transparent layers in electronic devices.

BACKGROUND

Electronic devices such as cellular telephones may have displays. To protect the display in an electronic device, the electronic device may be provided with a protective display cover glass. Display cover glass may be coated.

SUMMARY

An electronic device may have a housing. The housing may be surrounded by an exterior region and may enclose an interior region. Electronic components such as sensors, integrated circuits, and other circuitry may be mounted in the interior region.

Housing walls such as housing walls formed from transparent layers of material may separate the interior region from the exterior region. A display may be visible through one of the transparent layers of material.

The transparent layers of material may be formed of glass or glass-ceramic and may have two opposing chemically strengthened surface layers of different thicknesses. A coating may be formed on a thinner of the two opposing chemically strengthened surface layers. The coating may have an oleophobic outer coating layer, an antireflection layer, and an antiscratch coating layer. The antiscratch layer may have one or more compressively stressed dielectric layers and may have one or more corresponding graded composition layers. The compressively stressed dielectric layers may help prevent damage such as scratches. The graded composition layers may help promote adhesion, enhance scratch resistance, and reduce shear stress where the coating contacts the transparent layer of material.

DETAILED DESCRIPTION

Electronic devices may include transparent layers of material. As an example, an electronic device with a display may have a transparent layer that overlaps and protects the display. This type of protective layer, which may sometimes be referred to as a display cover layer, may be formed from glass, glass-ceramic (sometimes referred to as ceramic-hardened glass), or other transparent materials. Transparent layers such as these may also be used in forming rear housing walls and/or other parts of an electronic device housing.

Figure 1:
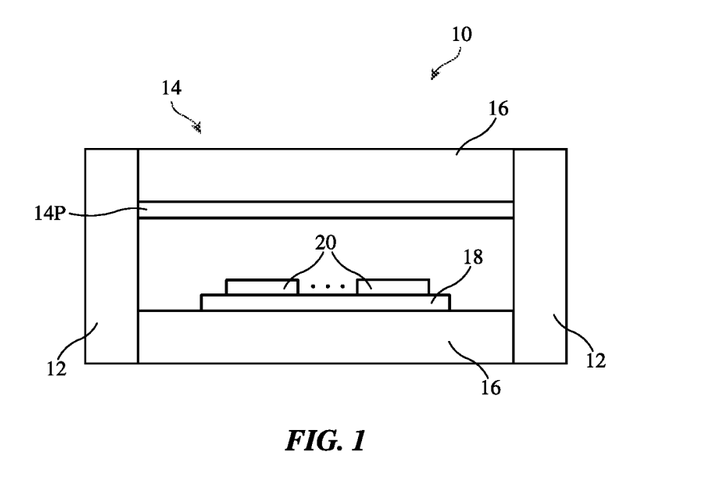
FIG. 1 is a cross-sectional side view of an illustrative electronic device in accordance with an embodiment.

A cross-sectional side view of an illustrative electronic device of the type that may include transparent layers of material is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, an accessory (e.g., earbuds, a remote control, a wireless trackpad, etc.), or other electronic equipment.

As shown in FIG. 1, device 10 may include components such as display 14. Display 14 may be mounted in housing 12. Housing 12 may separate an interior region within device 10 from an exterior region surrounding device 10. Housing 12, which may sometimes be referred to as an enclosure or case, may be formed of plastic, glass, glass-ceramics, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Display 14 may have a pixel array configured to display images. For example, display 14 may include a display panel such as display panel 14P that includes an array of pixels. Display panel 14P may be a liquid crystal display panel, an organic light-emitting diode display panel, a light-emitting diode display panel formed from crystalline semiconductor light-emitting diode dies, or other display structures.

Device 10 may have one or more layers of glass, glass-ceramic, or other transparent layers such as layers 16. In the example of FIG. 1, one of layers 16 covers display panel 14P and serves as a display cover layer for display 14 and another of layers 16 forms a rear housing wall. The inner surface of the rear housing wall may be covered with opaque material to hide internal components in device 10 from view. As shown in FIG. 1, these internal components may include electrical components 20 mounted on one or more printed circuits such as printed circuit 18. Components 20 may include control circuitry (e.g., integrated circuits, etc.), input-output devices (e.g., buttons, touch sensors, cameras, and other sensors, output devices such as light-emitting diodes, speakers, and haptic output devices), radio-frequency wireless communications circuitry and other communications circuitry, and/or other components.

In general, transparent structures such as layers 16, which may be considered to form parts of the housing of device 10, may be formed in any suitable portions of device 10 (e.g., these transparent structures may form housing sidewalls, camera lenses, rear and/or front housing members, display cover layers, and/or other suitable transparent structures in device 10).

Because layers 16 have surfaces that are exposed to the exterior of device 10, these surfaces may be susceptible to scratches, chipping, and/or other damage when device 10 is dropped, scratched with a hard object, or otherwise exposed to excessive wear. Layers 16 may be provided with coatings to help protect layers 16.

Figure 2:
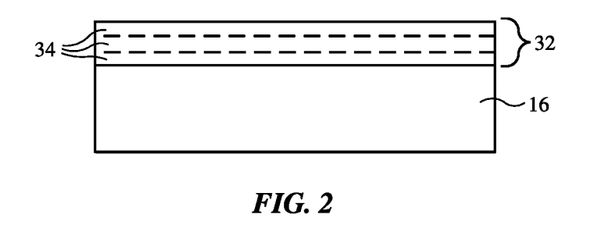
FIG. 2 is a cross-sectional side view of an illustrative coated transparent layer in accordance with an embodiment.

FIG. 2 is a cross-sectional side view of an illustrative transparent layer with a coating. As shown in FIG. 2, layer 16 (e.g., a glass layer, a layer of glass-ceramic, or other transparent layer) may be provided with a coating such as coating 32. Coating 32 may include one or more sublayers such as layers 34. Layers 34 may include, for example, layers of material that serve as antiscratch layers (sometimes referred to as hard coats, antiscratch coatings, antiscratch coating layers, etc.), anti-smudge layers, anti-fog layers, antireflection layers, anti-static layers, and/or other coatings. In some configurations, each of these functions may be implemented using a separate respective coating layer 34 or a single set of coating layers 34. In other configurations, a single layer 34 or a set of layers 34 may serve multiple functions.

In an illustrative arrangement, which may sometimes be described herein as an example, the outermost layer 34 of coating 32 may be a fluoropolymer coating (e.g., a fluoropolymer formed from evaporated perfluoropolyether) that serves as an oleophobic coating layer (e.g., an anti-smudge coating). The lowermost layer(s) 34 of coating 32 may form a scratch-resistant coating. One or more of layers 34 between the oleophobic coating and the scratch-resistant coating may be configured to form an antireflection layer (e.g., a thin-film interference filter antireflection coating formed from a stack of dielectric layers of differing refractive index values such as refractive index values that alternate between higher and lower values).

To help prevent scratches, the antiscratch portion of coating 32 may be formed from hard material. This hard material may be, as an example a material such as silicon nitride or silicon oxynitride that has a hardness value that is greater than transparent layer 16. The antiscratch layer may be placed in compressive stress, which helps the antiscratch layer to prevent scratch damage and crack propagation (e.g., when device 10 is subjected to stress from an undesired drop event and/or other contact with objects that can scratch, chip, and/or otherwise damage device 10). In an illustrative configuration, the amount of compressive stress in one or more portions of the antiscratch coating may be at least 400 MPa, at least 500 MPa, or at least 1000 MPa (as examples).

When coating 32 contains high levels of compressive stress (e.g., due to inclusion of antiscratch layers that have at least 400 MPa of compressive stress), there is a risk that this stress could deform layer 16. If, as an example, layer 16 is a symmetric layer of uncoated glass or glass-ceramic and only one surface of layer 16 is coated, the compressive stress in the coating could cause that surface to become convex due to bending of layer 16 as the compressively stressed coating expands while attempting to relieve its built-in stress.

To counteract this tendency of layer 16 to acquire a convex outer surface in the presence of coating 32, layer 16 may be processed to form asymmetric built-in stress on the opposing surface layers of layer 16 prior to coating deposition. For example, an outwardly facing surface layer can be configured to exhibit less compressive stress than an opposing inwardly facing surface layer to compensate for the additional compressive stress imparted on layer 16 by coating 32.

Consider, as an example, the illustrative fabrication operations of FIGS. 3, 4, 5, and 6.

Figure 3:
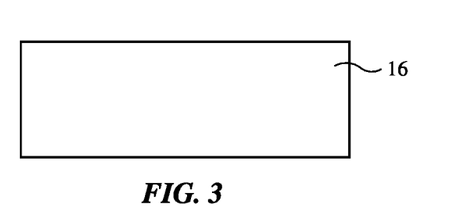
FIGS. 3, 4, 5, and 6 show illustrative operations for coating a transparent layer in accordance with an embodiment.

Initially, layer 16 may be uncoated and untreated. Layer 16 may be, for example, an unstrengthened and uncoated sheet of glass or glass-ceramic, as shown in FIG. 3.

Figure 4:
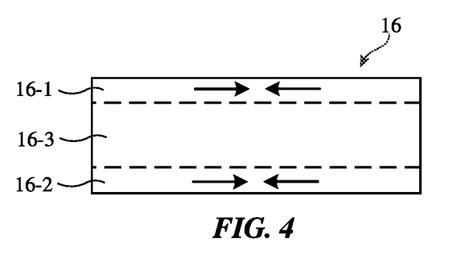

To help provide layer 16 with the ability to resist damage from drop events and localized scratches, the surfaces of layer 16 may be strengthened (e.g., by thermal tempering and/or chemical strengthening). As shown in FIG. 4, for example, layer 16 may be chemically strengthened to place outer surface layer 16-1 of layer 16 and opposing inner surface layer 16-2 of layer 16 in compressive stress relative to core portion 16-3 of layer 16, which is therefore in tensile stress. Layer 16 may be chemically strengthened by performing an ion-exchange process on layer 16 of FIG. 3. During the ion-exchange process, smaller ions in the glass may be replaced with larger ions. For example, sodium in the glass at the exposed surfaces of layer 16 may be replaced by potassium. This creates compressive stress within the treated surface layers of layer 16.

Figure 5:
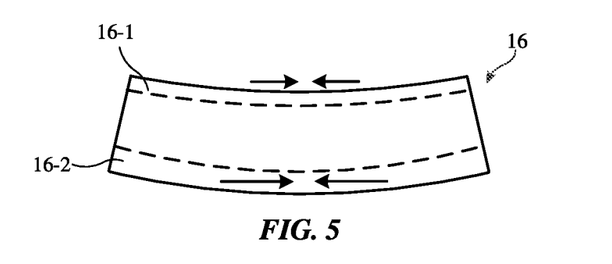

The compressive stress created in layers 16-1 and 16-2 of FIG. 4 due to chemical strengthening of layer 16 is symmetric. As a result, the compressive stress in layer 16-1 is balanced by the equal compressive stress in layer 16-2 and layer 16 tends to remain undistorted (e.g., planar as shown in FIG. 4). To prepare for the deposition of coating 32, which is expected to provide additional compressive stress, layer 16-1 may be thinned by polishing. As shown in FIG. 5, by thinning layer 16-1 while leaving the thickness of layer 16-2 unchanged, an unbalanced compressive stress environment is created. Layer 16-2 is thicker than thinned layer 16-1, so layer 16-2 is able to expand outwardly more than layer 16-1, causing layer 16 to bow as shown in FIG. 5. The outwardly facing surface of layer 16 therefore temporarily becomes slightly concave (e.g., the bowing of layer 16 may result in an inward deflection of 0.1 mm to 1 mm in the middle of layer 16 relative to the edges of layer 16 when layer 16 has lateral dimensions of about 5-30 cm (as an example).

Figure 6:
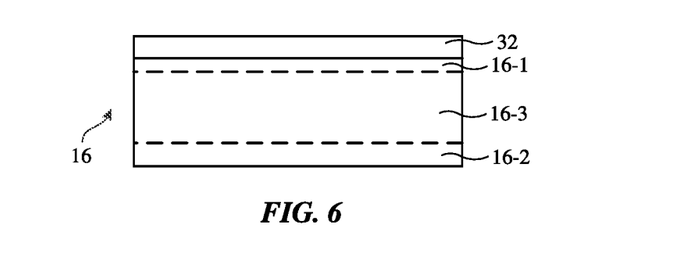

Following creation of the asymmetric distribution in the compressive stress from the opposing chemically strengthened inner and outer surface layers of layer 16, coating 32 may be deposited on the surface of layer 16-1 (e.g., by depositing one or more layers 34 using physical vapor deposition techniques such as magnetron sputtering and/or other deposition techniques that impart compressive stress to the deposited material). As a result, coating 32 will be compressively stressed. As shown in FIG. 6, the amount of compressive stress imparted by coating 32 on layer 16 is configured to counterbalance the amount of compressive stress that was lost from layer 16-1 when layer 16-1 was thinned during the polishing operations of FIG. 5. As a result, the combined compressive stress of coating 32 and surface layer 16-1 will equal the compressive stress of surface layer 16-2. Because coating 32 and layer 16-1 are formed on the opposite surface of layer 16 from layer 16-2, layer 16 will have equal amounts of compressive stress on its inner and outer surfaces and will therefore become planar (e.g., layer 16 will no longer be bowed as shown in FIG. 5, but instead will be characterized by inner and outer surfaces that are flat and parallel to each other as shown in FIG. 6).

In the illustrative configuration of FIGS. 3, 4, 5, and 6, asymmetric amounts of compressive stress are created in the upper and lower surfaces of layer 16 using a symmetric ion exchange process (creating equal amounts of compressive stress in layers 16-1 and 16-2 of FIG. 4) followed by selective thinning to reduce the thickness of layer 16-1 and thereby reduce the amount of compressive stress on the upper surface of layer 16 relative to the amount of compressive stress on the lower surface of layer 16. If desired, asymmetric compressive stress may be created in layer 16 by using an asymmetric ion exchange process (in addition to or instead of using asymmetric polishing techniques). For example, a first ion exchange process may be used to impart a first amount of compressive stress to layer 16-1 of FIG. 4 and a second ion exchange process may be used to impart a second amount of compressive stress to layer 16-2, where the second amount of compressive stress is larger than the first amount of compressive stress. Following creation of unequal amounts of compressive stress in this way, layer 32 may be deposited as described in connection with FIG. 6. If desired, optional additional polishing may be applied to layer 16-1, so that layer 16-1 has less compressive stress due to both: 1) using the first ion exchange process instead of the second ion exchange process and 2) being polished more than layer 16-2. In general, any suitable technique (e.g., use of asymmetric polishing and/or use of asymmetric ion exchange processing) may be used in forming surface layers 16-1 and 16-2 with different amounts of compressive stress to accommodate coating 32.

To build sufficient compressive stress into coating 32 to resist damage, one or more high-compressive-stress layers 34 may be included in coating 32. These high stress layers may be formed from hard materials such as silicon nitride and/or silicon oxynitride or other hard inorganic materials (as examples). The amount of compressive stress produced in these layer(s) 34 may be at least 400 MPa, at least 500 MPa, at least 1000 MPa, 400-2000 MPa, 1200 MPa, less than 1500 MPa, etc. To reduce shear stress at the interfaces between layers 34, one or more of layers 34 may be graded composition layers. The graded composition layers may be characterized by graded compositions and therefore other graded properties (e.g., graded refractive index, graded stress, and graded Young's modulus). The graded composition and other properties of the graded composition layers vary as a function of depth through the layer. As an example, a graded composition layer may vary in a graded fashion (e.g., continuously without steps or in a stepwise fashion having numerous small steps) between a first composition at a first surface such as a surface associated with an interface with a high stress layer and a second composition at a second surface such as a surface associated with an interface with the outer surface of layer 16. The graded composition layer may exhibit an amount of compressive stress that varies from a high amount at the first surface to a low amount at the second surface. In this way, shear stresses at the interfaces within coating 32 may be reduced. For example, shear stress at the surface of layer 16 where coating 32 is deposited on layer 16 may be reduced by placing a graded composition layer on the surface of layer 16 that serves as a buffer between layer 16 and the highly compressively stressed layer(s) in coating 32. The use of the graded composition layer may also enhance adhesion (e.g., adhesion with layer 16 may be promoted) and may help enhance the overall scratch resistance of coating 32.

In some embodiments, antireflection coatings may be included in coating 32 and/or an oleophobic layer may be formed at the outer surface of coating 32 in addition to including a scratch resistant coating formed from one or more high-compressive-stress layers and one or more graded composition layers. If desired, the scratch resistance of coating 32 may be enhanced by selecting a material for layer 16 such as glass-ceramic or fracture-resistant glass that has a high fracture resistance. Illustrative configurations in which layer 16 is a glass-ceramic layer may sometimes be described herein as an example.

Figure 7:
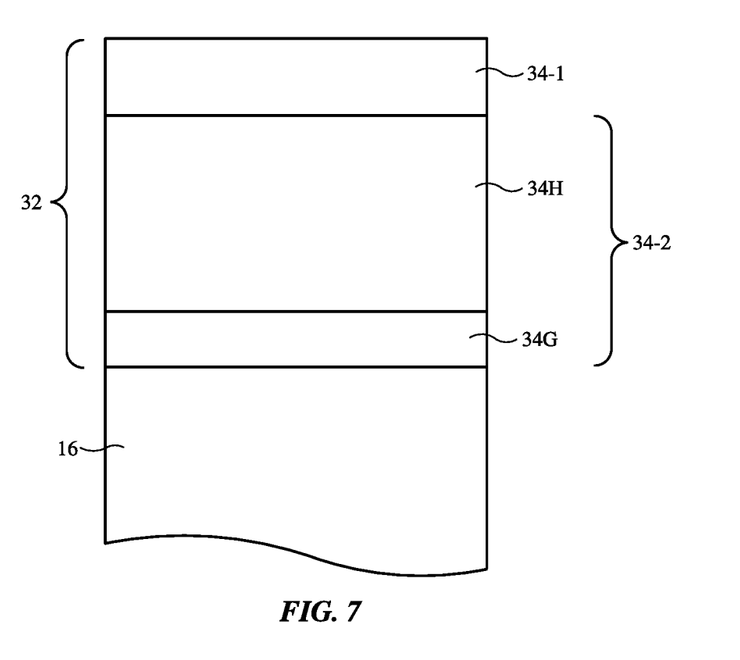
FIGS. 7, 8, 9, and 10 are cross-sectional side views of illustrative coated transparent layers in accordance with embodiments.

An illustrative coating for layer 16 is shown in FIG. 7. In the example of FIG. 7, coating 32 includes an anti-smudge layer such as oleophobic layer 34-1 to help prevent fingerprints on the exposed outer surface of device 10. When layer 16 is used as a display cover layer that overlaps display panel 14P of display 14, for example, a user may provide touch input to a touch sensor in display 14. While providing touch input in this way, the user's fingers may press against the outer surface of the display cover layer. By using oleophobic layer 34-1, the visibility of fingerprints may be reduced, thereby helping to improve the visual quality of images on panel 14P that are being viewed by the user.

Antiscratch layer 34-2 may be formed between layer 34-1 and the outwardly facing surface of layer 16. In the illustrative configuration of FIG. 7, antiscratch layer 34-2 includes a high-compressive-stress layer 34H and graded composition layer 34G (sometimes referred to as a gradient layer, gradient composition layer, graded layer, etc.). Layer 34H may be formed from an inorganic dielectric under high compressive stress. As an example, layer 34H may be formed from silicon oxynitride (SiON). The compressive stress of layer 34H may be at least 400 MPa, 500 MPa, at least 250 MPa, at least 500 MPa, at least 1000 MPa, less than 1000 MPa, or other suitable value. The thickness of layer 34H may be 1800 nm or other suitable thickness (e.g., at least 900 nm, at least 1500 nm, less than 3600 nm, etc.). Graded composition layer 34G may have a composition that is graded and therefore changes as a function of distance through layer 34G. At the surface of layer 34G that forms the interface between layer 34G and 34H, the composition of layer 34G may match that of layer 34H (e.g., layer 34G may be formed entirely from or primarily from silicon oxynitride with a stoichiometry that matches the stoichiometry of the silicon oxynitride of layer 34H at this interface). At the interface between layer 34G and layer 16, layer 34G may have a composition that matches that of layer 16 (e.g., layer 34G may be formed entirely from or primarily from silicon oxide at this interface). The silicon oxide may be, for example $SiO_2$, SiO, or an oxide of silicon with another suitable stoichiometry. Between the two surfaces of layer 34G, the composition of layer 34G may be graded and may vary from 100% silicon oxynitride (SiON) of matching stoichiometry with layer 34H to 100% silicon oxide (SiO or $SiO_2$, etc.) of matching stoichiometry with layer 16 smoothly and continuously or in a series of small discrete steps.

The hardness and compressive stress of the materials in antiscratch layer 34-2 helps enhance the bend strength of layer 34-2 while resisting scratch damage. This satisfactory scratch resistance performance for layer 34-2 may be obtained when forming layer 16 from glass-ceramic (which has an intrinsically high fracture resistance) or other glass with high fracture resistance.

Figure 8:
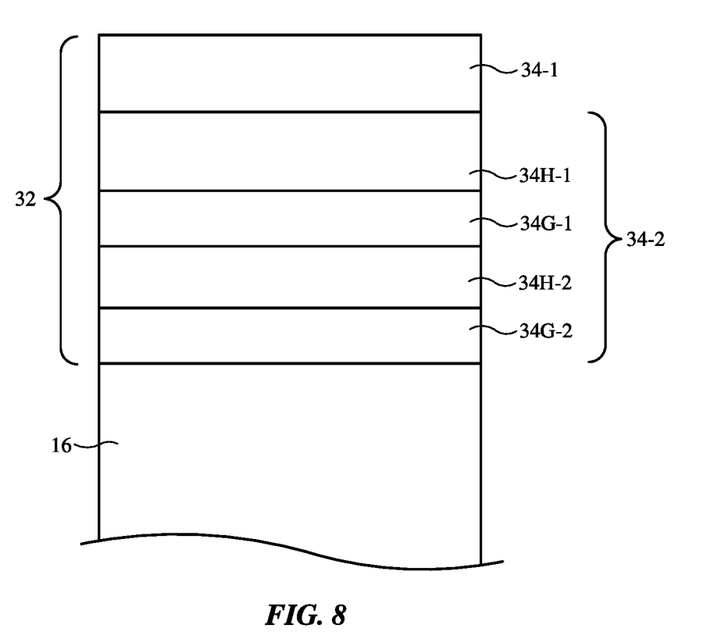

Another illustrative configuration for coating 32 is shown in FIG. 8. In the example of FIG. 8, antiscratch layer 34-2 includes upper high-compressive stress layer 34H-1 and lower high-compressive-stress layer 34H-2. Layer 34H-1 may be formed from a highly compressively stressed inorganic dielectric such as silicon nitride (SiN). The thickness of layer 34H-1 may be 500 nm, at least 250 nm, less than 1000 nm, or other suitable thickness. The compressive stress of layer 34H-1 may be 1000 MPa, at least 400 MPa, at least 500 MPa, at least 1000 MPa, less than 2000 MPa, or other suitable value. Layer 34H-2 may be formed from a highly compressively stressed inorganic dielectric such as silicon oxynitride (SiON). The thickness of layer 34H-2 may be 1000 nm, at least 500 nm, less than 2000 nm, or other suitable thickness. The compressive stress of layer 34H-2 may be 700 Mpa, at least 350 MPa, at least 400 MPa, at least 500 MPa, less than 1400 MPa, less than 1000 MPa, or other suitable value.

Gradient layer 34G-1 may have a composition that varies from 100% (or nearly 100%) SiN at the interface with layer 34H-1 to 100% (or nearly 100%) SiON at the interface with layer 34H-2. The thickness of layer 34G-1 may be 300 nm, at least 150 nm, less than 600 nm, or other suitable thickness.

Gradient layer 34G-2 may have a composition that varies from 100% (or nearly 100%) SiON at the interface with layer 34H-2 to 100% (or nearly 100%) SiO at the interface with layer 16.

The use of one or more gradient layers in layer 34-2 may help gradually reduce the compressive stress in layer 34-2 as a function of increasing distance through layer 34-2 from layer 34-1 towards layer 16. With gradient layer arrangements such as those in FIGS. 7 and 8, antiscratch functionality is obtained by creating a high compressive stress (e.g., at least 250 MPa, at least 400 MPa, at least 500 MPa, at least 1000 MPa, etc.) near the outer surface of layer 34-2 and a relatively lower compressive stress at the interface with layer 16 (so as not to compromise scratch resistance by excessive shear stress at the interface between layer 34-2 and layer 16). The stress of layer 34-2 at the interface with layer 16 may be less than the highly-stressed portion(s) of layer 34-2 such as the compressively stressed material at upper surface of layer 34H-1 or the upper surface of layer 34H-2 of FIG. 8 (or the compressively stressed portion of layer 34H of FIG. 7 at the upper surface of layer 34H) by at least 1%, at least 10%, at least 20%, at least 25%, at least 40%, or other suitable reduced amount.

The index of refraction of SiON is greater than the refractive index of SiO (and is generally greater than the refractive index of layer 16). The refractive index of SiN is greater than the refractive index of SiON. As a result of the presence of SiON in layer 34H of layer 34-2 in FIG. 7, the reflectivity of layer 16 with coating 32 of FIG. 7 may be about 6%, as opposed to uncoated glass, which may exhibit a reflectivity of about 4%. The presence of SiN in layer 34H-1 of layer 34-2 of FIG. 8 may cause the reflectivity of layer 16 with coating 32 of FIG. 8 to be about 10%.

To help increase light transmission for layer 16 when coated with coating 32 (e.g., so that layer 16 may be used as a display cover layer for display 14), it may be desirable to incorporate one or more thin-film dielectric layers into coating 32 that serve as a thin-film interference filter antireflection layer. In the illustrative configuration of FIG. 9, coating 32 includes antireflection layer 34-3. Antireflection layer 34-3 of FIG. 9 includes a stack of thin-film dielectric layers formed from three dielectric layers with alternating refractive index values. These layers include two layers 34L formed from a lower refractive index material such as SiO and a layer 34B of a higher refractive index material such as SiN that is sandwiched between layers 34L. The thickness of the upper layer 34L may be 99.5 nm, the thickness of layer 34H may be 166 nm, and the thickness of the lower layer 34L may be 10 nm (as an example). The inclusion of an antireflection layer in coating 32 of FIG. 9 such as antireflection layer 34-3 may help reduce visible light reflectivity to 4%, less than 6%, less than 5%, less than 4%, less than 2%, or less than 1% (as examples).

Figure 9:
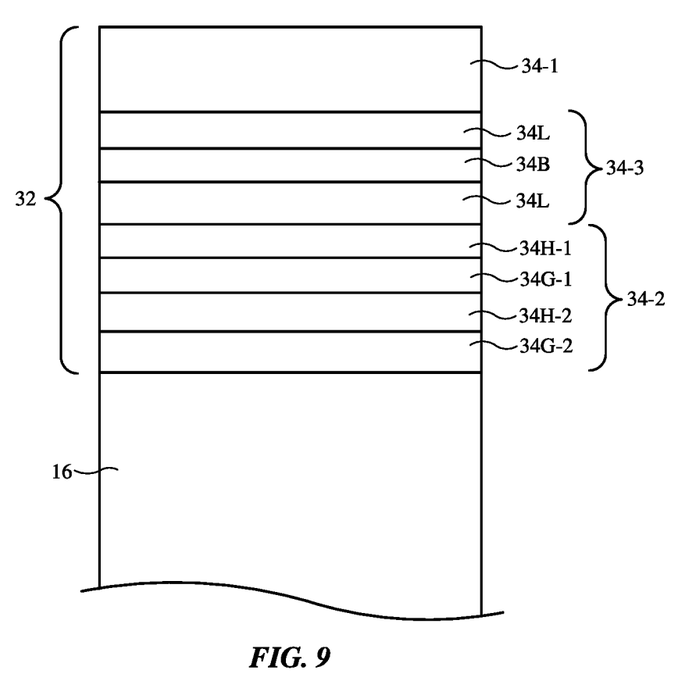

Layer 34H-1 of FIG. 9 may be a silicon nitride layer and may have a thickness of 393 nm, at least 200 nm, less than 800 nm, or other suitable thickness. Layer 34G-1 of FIG. 9 may be a graded composition layer that varies between 100% SiN (at the interface with layer 34H-1) and SiON with the same stoichiometry as the SiON of layer 34H-2 (at the interface with layer 34H-2). The thickness of layer 34G-1 may be 314 nm, at least 150 nm, less than 600 nm, or other suitable thickness. Layer 34H-2 of FIG. 9 may be an SiON layer and may have a thickness of 1000 nm, at least 500 nm, less than 2000 nm, or other suitable thickness. Layer 34G-2 of FIG. 9 may be a graded composition layer that varies between SiON (with a stoichiometry that matches that of layer 34H-2) at the interface with layer 34H-2 and 100% SiO (at the lower surface of layer 34H-2 that forms the interface with layer 16). The thickness of layer 34G-2 may be 200 nm, at least 100 nm, less than 400 nm, or other suitable thickness.

Figure 10:
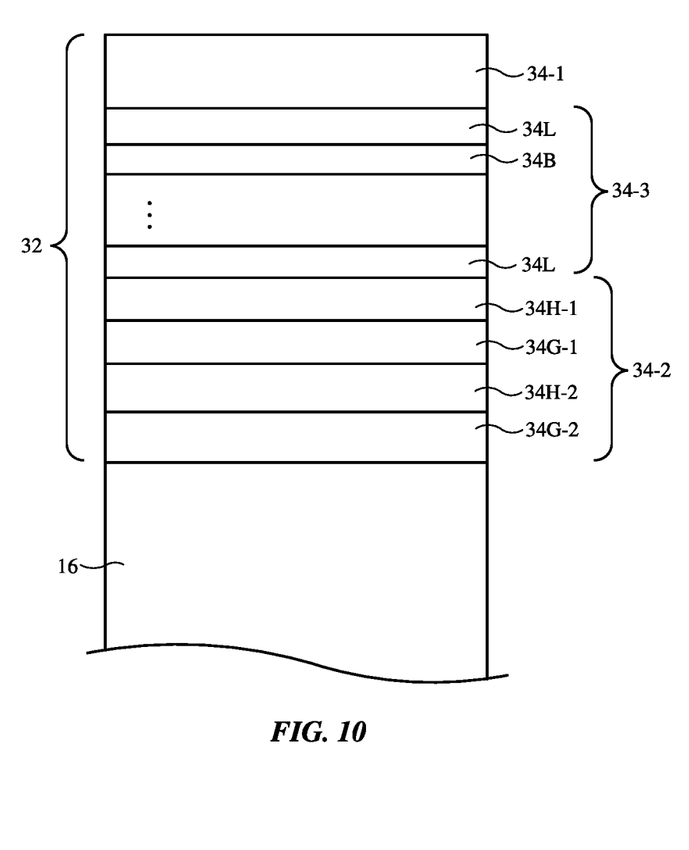

If desired, antireflection layer 34-3 may be formed from a stack of alternating index thin-film dielectric layers containing scratch resistant materials. This type of arrangement is shown in the example of FIG. 10. In the arrangement of FIG. 10, antireflection layer 34-3 is a thin-film interference filter configured to reduce visible light reflection for layer 16 and contains layers of alternating refractive index such as layers 34L of lower refractive index and layers 34H of higher refractive index. There may be any suitable number of stacked dielectric layers in layer 34-3 (e.g., at least 3, at least 5, at least 10, 10-20, fewer than 50, fewer than 30, fewer than 25, etc.). As an example, there may be 9-11 high index layers interleaved with 9-11 low index layers. As with the arrangement of FIG. 9, the thicknesses and refractive indices of the layers in antireflection layer 34-3 may be selected to help reduce light reflections from coating 32 and layer 16 (e.g., to help reduce the reflectivity of layer 16 when coated with coating 32 to less than 5%, less than 4%, or less than 2%, as examples). Layers 34L of FIG. 10 may be formed from SiON with a high amount of compressive stress to help resist scratches. Layers 34H may be formed from SiN, which is a hard dielectric that helps resist scratches. By using these materials (e.g., materials that are at least as hard as SiON) in forming antireflection layer 34-3, the ability of coating 32 to withstand scratches may be enhanced relative to arrangements that use softer thin-film layers in antireflection layer 34-3.

The stress value of the coatings formed on layer 16 may be averaged to produce an average stress value. In an illustrative configuration, the average compressive stress value for the coating layers on layer 16 is in the range of 677 to 734 MPa (e.g., for an arrangement of the type shown in FIG. 7) and is 811 to 1031 MPa (for arrangements of the type shown in FIGS. 8, 9, and 10). Lower and higher values (e.g., at least 500 MPa, less than 1400 MPa, etc.) may be used, if desired.

The hardness value of the silicon oxynitride layer of FIG. 7 (e.g., layer 34H) may be 1475 HV/15.934 GPa, may be at least 1000 HV, may be less than 2000 HV, etc.

The refractive index of the silicon oxynitride in the coating layers may be 1.75, may be 1.7-1.8, or may have another suitable refractive index value (e.g., at a wavelength of 500 nm or other suitable visible light wavelength).

Although sometimes described in the context of layers 16 formed from glass-ceramic, layers 16 may, if desired, be formed from glass or other materials with sufficient fracture toughness (e.g., greater than 0.9 MPa-m$^{1/2}$ or other suitable amount and/or a Young's modulus of greater than 90 GPa or other suitable amount).

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:
   a display;
   a sensor; and
   a coated transparent layer overlapping the display and the sensor, wherein the coated transparent layer comprises:
      a layer of glass-ceramic, wherein the layer of glass-ceramic comprises first and second opposing chemically strengthened surface layers, and the first chemically strengthened surface layer is thinner than the second chemically strengthened surface layer; and
      a coating on the glass-ceramic that comprises an anti-scratch layer, the antiscratch layer comprising:
         a compressively stressed layer; and
         graded composition layer that extends from the compressively stressed layer to the layer of glass-ceramic, wherein the coating is directly on the first chemically strengthened surface layer.

2. The electronic device defined in claim 1 wherein the compressively stressed layer comprises a silicon oxynitride layer and wherein the graded composition layer has a composition varying from silicon oxynitride to silicon oxide as a function of distance through the graded composition layer.

3. The electronic device defined in claim 2 further comprising:

an oleophobic layer; and an antireflection layer between the oleophobic layer and the compressively stressed layer.

4. The electronic device defined in claim 3 wherein the antireflection layer comprises alternating layers of first and second dielectric with respective first and second refractive index values.

5. The electronic device defined in claim 4 wherein the first dielectric comprises silicon oxynitride.

6. The electronic device defined in claim 5 wherein the second dielectric comprises silicon nitride.

* * * * *